United States Patent
Nagaishi

Patent Number: 5,618,446
Date of Patent: Apr. 8, 1997

[54] METHOD FOR FORMING A STEP ON A DEPOSITION SURFACE OF A SUBSTRATE FOR A SUPERCONDUCTING DEVICE UTILIZING AN OXIDE SUPERCONDUCTOR

[75] Inventor: Tatsuoki Nagaishi, Hyogo, Japan

[73] Assignee: Sumitomo Electric Industries, Ltd., Osaka, Japan

[21] Appl. No.: 393,485

[22] Filed: Feb. 24, 1995

[30] Foreign Application Priority Data

Feb. 25, 1994 [JP] Japan ........................................ 6-53088

[51] Int. Cl.$^6$ .................................. C25F 3/00; B44C 1/22
[52] U.S. Cl. .............................. 216/65; 216/76; 505/329; 505/412
[58] Field of Search ..................... 216/65, 76; 505/412, 505/329

[56] References Cited

U.S. PATENT DOCUMENTS

| 4,900,892 | 2/1990 | Baeuerle et al. ........................ 505/412 |
| 5,439,875 | 8/1995 | Tanaka et al. .......................... 505/329 |

*Primary Examiner*—Richard L. Schilling
*Attorney, Agent, or Firm*—Beveridge, DeGrandi, Weilacher & Young, LLP

[57] ABSTRACT

The present invention relates to a method for foxing a step on a deposition surface of a substrate for depositing a thin film on it. According to the method, the step is formed by etching a portion of the deposition surface of the substrate by emitting a laser beam to the portion.

6 Claims, 3 Drawing Sheets

METHOD FOR FORMING A STEP ON A DEPOSITION SURFACE OF A SUBSTRATE FOR A SUPERCONDUCTING DEVICE UTILIZING AN OXIDE SUPERCONDUCTOR

BACKGROUND OF THE INVENTION

1. Field of the Invention

The present invention relates to a method for forming a step on a deposition surface of a substrate for a superconducting device utilizing an oxide superconductor, and more specifically a to method for forming a step on a deposition surface of a substrate for a superconducting device such as a step edge type Josephson junction device of an oxide superconductor.

2. Description of Related Art

A Josephson junction device which is one of the most famous superconducting devices can be realized in various structures, for example, a stacked type (tunnel type) junction realized by a thin non-superconductor layer sandwiched between a pair of superconductors, a point contact type junction, a micro bridge type junction and a variable thickness bridge type junction which are composed of a pair of superconductor regions which are weakly linked to each other.

These Josephson junctions have fine structures so that fine processings are required to realize Josephson junction devices.

In order to realize a stacked type junction by using an oxide superconductor, a first oxide superconductor thin film, a non-superconductor thin film and a second oxide superconductor thin film are stacked on a substrate in the named order.

The thickness of the non-superconductor layer of the stacked type junction is determined by the coherence length of the superconductor. In general, the thickness of the non-superconductor layer of the stacked type junction must be within a few times of the coherence length of the superconductor. Since oxide superconductor materials have a very short coherence length, therefore, a thickness of a non-superconductor layer must be about a few nanometers.

However, the superconductor layers and the non-superconductor layer of the stacked type junction must be of high crystallinity for favorable junction properties, which are composed of single crystals or composed of polycrystals which are orientated in an almost same direction. It is difficult to stack an extremely thin and high crystalline non-superconductor layer on an oxide superconductor layer. Additionally, it is very difficult to stack a high crystalline oxide superconductor layer on the non-superconductor layer stacked on an oxide superconductor layer. Though the stacked structure including a first oxide superconductor layer, a non-superconductor layer and a second oxide superconductor layer is realized, the interfaces between the oxide superconductor layers and the non-superconductor layer are not in good condition so that the stacked type junction does not function in good order.

In order to manufacture a point contact type junction, a micro bridge type junction and a variable thickness bridge type junction by using oxide superconductor, very fine processings which realize a weak link of a pair of the superconductors are necessary. It is very difficult to conduct a fine processing with good repeatability.

The point contact type junction has been formed of two oxide superconductor thin films which are in contact with each other in a extremely small area which constitutes the weak link of the Josephson junction.

The micro bridge type junction has been formed of a constant thickness oxide superconductor thin film which is formed on a substrate and which is patterned in a plan view, so that a superconductor thin film region having a greatly narrow width is formed between a pair of superconductor thin film regions having a sufficient width. In other words, the pair of superconductor thin film regions having a sufficient width are coupled to each other by the superconductor thin film region having the greatly narrow width. Namely, a weak link of the Josephson junction in the superconductor thin film is formed at the greatly narrow width region.

On the other hand, the variable thickness bridge type junction has been foraged of an oxide superconductor thin film of a sufficient thickness which is formed on a substrate and which is partially etched or thinned in a thickness direction, so that a thinned oxide superconductor thin film portion is formed between a pair of superconductor thin film portions having the sufficient thickness. In other words, the pair of superconductor thin film portions having the sufficient thickness are coupled to each other by the thinned oxide superconductor thin film portion. Accordingly, a weak link of the Josephson junction is formed at the reduced thickness portion of the oxide superconductor thin film.

As would be understood from the above, characteristics of the Josephson junction device are a close relation to the contact area of the superconductor thin film in the point contact type Josephson device, the width of the superconductor thin film region having the extremely narrow width in the micro bridge type Josephson device, and the thickness of the thinned oxide superconductor thin film portion in the variable thickness bridge type Josephson device, both of which form the weak link of the Josephson junction. Therefore, in order to obtain the desired characteristics with a good repeatability, a high precision on a sub-micron level of the processing such as the etching is required.

The micro bridge type Josephson device can be said to be more preferable than the variable thickness bridge type Josephson device, since the micro bridge type Josephson device has a relatively planer surface, which is preferred in a integrated circuit. However, in order to form the weak link in the micro bridge type Josephson device, it is required to pattern an oxide superconductor thin film having the thickness on the order of 0.5 μm to 1.0 μm into a width of not greater than 0.2 μm. However, it is very difficult to conduct this fine patterning with good repeatability.

On the other hand, in the variable thickness bridge type Josephson device, the very fine pattering is not required in order to form the weak link. However, it is very difficult to uniformly control the remaining thickness of the thinned portion forming the weak link. In addition, the variable thickness bridge type Josephson device cannot have a planer surface by nature. This is not preferable to the integrated circuit application.

In order to resolve the above mentioned problems, researches have been conducted to manufacture a Josephson junction device taking account of the characteristic advantages intrinsic to the oxide superconductor, which permits it to avoid the fine processing of the oxide superconductor.

The superconducting characteristics of the oxide superconductor considerably varys, depending on the crystalline direction. Particularly, the oxide superconductor has a large critical current density in the direction perpendicular to the c-axes of its crystals. Thus, if oxide superconductors having crystalline directions different from each other are joined together, a grain boundary at the interface becomes a barrier of the weak link so that a Josephson junction is formed. A Josephson junction device utilizing this Josephson junction is called an artificial grain boundary type Josephson junction device. A Josephson junction device of this type can be manufactured without the fine processing as mentioned above.

There is shown a sectional view of an example of the artificial grain boundary type Josephson junction device. The artificial grain boundary type Josephson junction device shown in FIG. 1 mainly consists of an oxide superconductor thin film 1 deposited on a deposition surface of an insulator substrate 2 having a step 23. A portion 13 of the oxide superconductor thin film 1 on the step 23 has a crystal orientation different from those of portions 11 and 12 of the oxide superconductor thin film 1 on deposition surfaces 21 and 22. By this, grain boundaries 51 and 52 are formed between the portions 11 and 13 and between the portions 12 and 13, which constitute a weak link of a Josephson junction.

The preferable height of the step 23 is considered to range from 100 to 500 nanometers and is determined by a thickness of the oxide superconductor thin film.

In order to manufacture the above Josephson junction device, in a prior art, the step of the substrate is generally formed by an ion milling using Ar ions. However, the deposition surface of the substrate is often degraded in its crystallinity by the ion milling process so that an oxide superconductor thin film having high quality can not be deposited on it. In addition, the ion milling is conducted under high vacuum, which requires a lot of time for evacuating, so that the deposition surface of the substrate can not be efficiently processed.

Furthermore, a niobium mask is sometimes used in the above processing of the deposition surface of the substrate, in order to form a steep step. Photoresist which is generally used for a mask of an etching process is rather soft so fix at an edge of a photoresist film gently rises. In case that the deposition surface of the substrate is etched by the ion milling with using a photoresist mask, a step gently rising is formed on the deposition surface. If an oxide superconductor thin film is deposited on the deposition surface having the step gently rising, no grain boundary might be formed in the oxide superconductor thin film. Since niobium is far harder than the photoresist, an edge of a niobium film abruptly rises. By using a niobium film as a mask, a steep step can formed on a deposition surface of a substrate. However, niobium may be remain on the deposition surface of the substrate even after the niobium film is removed. The remaining niobium has an adverse effect on an oxide superconductor thin film deposited on the deposition surface of the substrate.

SUMMARY OF THE INVENTION

Accordingly, it is an object of the present invention to provide a method for forming a step on a deposition surface of a substrate for a superconducting device utilizing an oxide superconductor, which overcomes the above mentioned defects of the conventional ones.

Another object of the present invention is to provide a method for manufacturing a Josephson junction device with good repeatability.

The above and other objects of the present invention are achieved in accordance with the present invention by a method for forming a step on a deposition surface of a substrate for depositing a thin film on it wherein the step is formed by etching a portion of the deposition surface of the substrate by emitting a laser beam to the portion.

In a preferred embodiment, the laser is a pulse oscillating ultra violet laser having a wavelength of not longer than 351 nanometers. The laser is preferably selected from the group consisting of a $F_2$ excimer laser, ArF excimer laser, KrF excimer laser, XeCl excimer laser, XeF excimer laser and harmonic laser of NdYAG laser. The laser preferably has an energy density ranging 100 miliJoules/cm$^2$ to 5 Joules/cm$^2$ per a pulse on the substrate.

According to a preferred embodiment of the present invention, the substrate is cooled during the etching. It is also preferable that an inert gas is jetted to the substrate during the etching.

In a preferred embodiment, the oxide superconductor is framed of high-$T_c$ (high critical temperature) oxide superconductor, particularly, formed of a high-$T_c$ copper-oxide type compound oxide superconductor for example a Y—Ba—Cu—O compound oxide superconductor material, a Bi—Sr—Ca—Cu—O compound oxide superconductor material, and a Tl—Ba—Ca—Cu—O compound oxide superconductor material.

The above and other objects, features and advantages of the present invention will be apparent from the following description of preferred embodiments of the invention with reference to the accompanying drawings.

DESCRIPTION OF THE PREFERRED EMBODIMENTS

Embodiment 1

Figure 2:
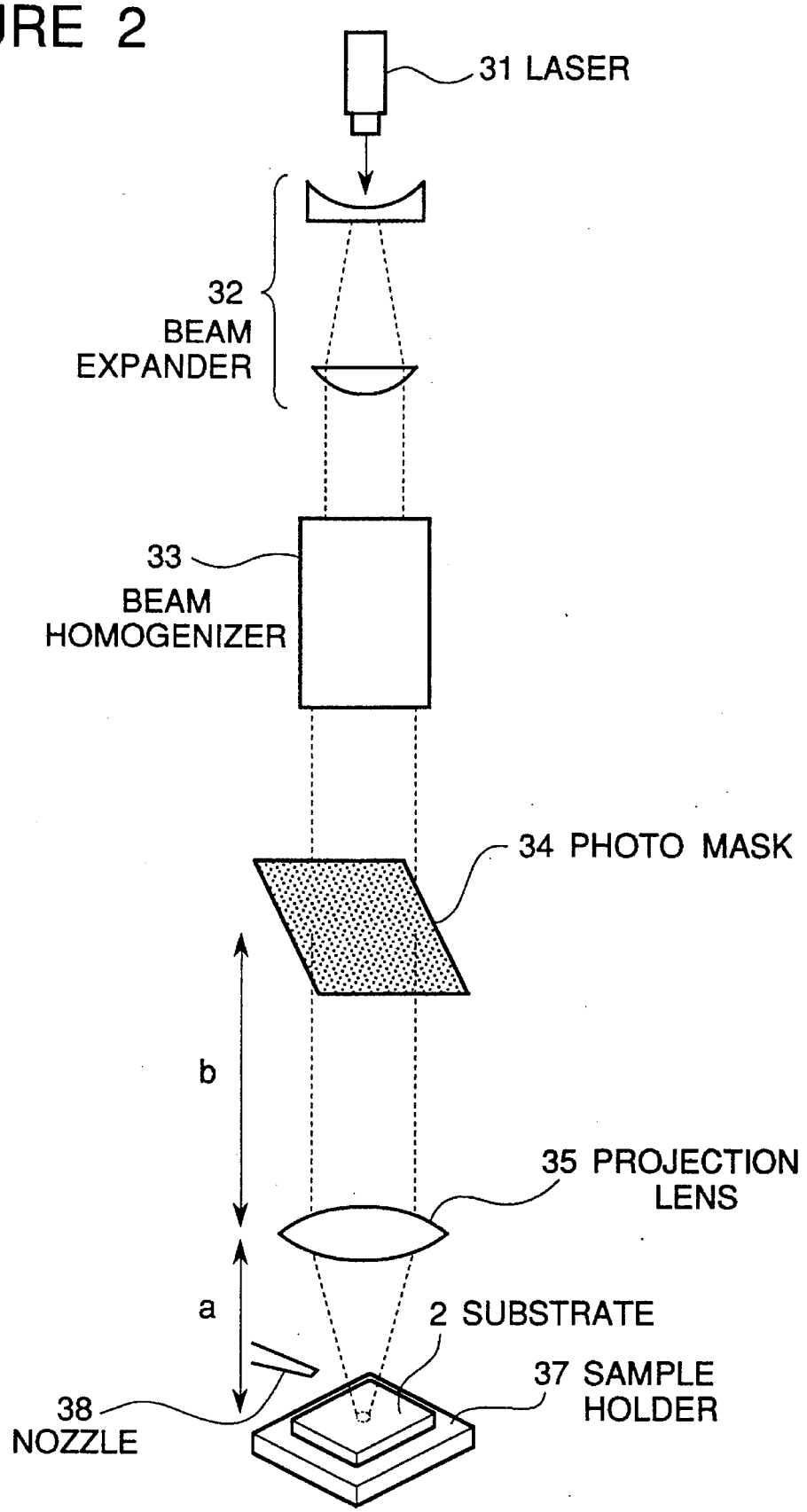
FIG. 2 is a schematic view illustrating an arrangement of optical devices utilized in the first embodiment of the method in accordance with the present invention.

Step edge type Josephson junction devices were manufactured by using SrTiO$_3$ single crystalline substrates having steps formed by the method in accordance with the present invention. Referring to FIG. 2, an arrangement of optical devices of an apparatus utilized in this embodiment will be described.

As shown in FIG. 2, the apparatus comprises an excimer laser 31, a beam expander 32 consisting of a cylindrical concave lens and a cylindrical convex lens, a beam homogenizer 33, a photomask 34 of an artificial quartz plate having a patterned aluminium thin film (which is used for a full reflection mirror for the excimer laser) on a surface, and a projection lens 35, which are coaxially disposed. A laser beam emitted from the excimer laser 31 passes through the beam expander 32, the beam homogenizer 33 and the photomask 34 and is projected to the substrate 2 set on a sample holder 37 by the projection lens 35 so as to etch the substrate 2. The sample holder 37 can be cooled by forced water cooling so as to prevent the substrate 2 from heating. It is difficult to measure an actual temperature of an irradiated area of the substrate 2. However, it is considered to be more than 1000° C. Therefore, forced water cooling is effective to prevent the irradiated area of the substrate surface from melting. In addition, a nozzle 38 is disposed near the substrate 2 to jet an inert gas to the substrate 2 so as to blow away vapors and debris.

In this embodiment, a $F_2$ excimer laser having a wave length of 157 nanometers, ArF excimer laser having a wave length of 193 nanometers, KrF excimer laser having a wave length of 248 nanometers, XeCl excimer laser having a wave length of 308 nanometers and XeF excimer laser having a wave length of 351 nanometers were used.

A laser beam having sectional dimensions 10 mm×30 mm was emitted by the excimer laser 31, which was expanded to 30 mm×30 mm by the beam expander 32. The expanded laser beam was homogenized in its energy distribution so as to be an uniform beam. The uniform beam passed through the photomask 34 so as to be projected to the substrate 2 set on a sample holder 37 by the projection lens 35.

When a distance between the projection lens 35 and substrate 2 was equal to a, a distance between the photomask and the projection lens 35 was equal to b and a focal length of the projection lens 35 was equal to f, the relation among a, b and f was represented by a following equation:

$$1/f = 1/a30\ 1/b$$

In this case, a projection rate M was equal to a/b. In this embodiment, the photomask 34 had a pattern of a dimension of 40 mm×40 mm and the substrate 2 had a dimension of 20 mm×20 mm. The distance a was equal to 250 mm, the distance b was equal to 500 mm and the focal length f was equal to 167 mm so as to realize a reduced projection of a rate of ½.

By using the above apparatus, the $SrTiO_3$ substrates were etched so as to form steps on their deposition surfaces. Representative conditions of the etching were shown as follows:

| Laser gas | $F_2$ | ArF | KrF | XeCl | XeF |
|---|---|---|---|---|---|
| Wavelength (nm) | 157 | 193 | 248 | 308 | 351 |
| Laser pulse rate (Hz) | 150 | 150 | 150 | 150 | 150 |
| Energy density (J/cm²) | 1.0 | 1.0 | 1.0 | 1.0 | 1.0 |
| Etching duration (min.) | 10 | 8 | 8 | 5 | 5 |

During the etching, the sample holder 37 was cooled by forced water cooling so as to prevent the substrate 2 from heating and nitrogen gas was jetted to the substrate 2 at a velocity of 1.0 meter/second and a flow rate 1000 sccm from the nozzle 38 so as to blow away debris.

Portions of the $SrTiO_3$ single crystal substrates 2 exposed to the laser beams were etched to a depth of 200 nanometers so as to form steps having a height of 200 nanometers. Steps formed on the substrates 2 abruptly rose at an angle of 85°. Observations of the steps formed by the etching of the five species of excimer lasers conducted by using a scanning electron microscopy showed little differences among them. In addition, it became clear that the etched surfaces of the substrates also had high crystallinity.

When the energy density of the laser beam was not more than 100 miliJoules/cm², no effective etching was performed so that it might take several tens hours to form a step having a required height. On the other hand, when the energy density of the laser beam was not less than 5 Joules/cm², an etched surface was roughened so that it became difficult to deposit a crystalline oxide superconductor thin film having excellent properties. Therefore, the energy density of the laser beam preferably ranges from 100 miliJoules/cm² to 5 Joules/cm².

Thereafter, the substrates on which the steps had been romped by the method in accordance with the present invention were cleaned by ultra sonic cleaning so as to remove dusts generated by the etching. $Y_1Ba_2Cu_3O_{7-x}$ oxide superconductor thin films having a thickness of 300 nanometers were deposited on the substrates by laser ablation. The conditions of the laser ablation process were as follows;

| | |
|---|---|
| Target | $Y_1Ba_2Cu_3O_{7-x}$ pellet (sintered) |
| Temperature of substrate | 700° C. |
| Atmosphere | $O_2$ |
| Pressure | 400 mTorr |
| Laser energy | 0.8 Joules/pulse |
| Density of laser energy | 2.0 Joules/cm² |
| Laser pulse rate | 5 Hz. |

The $Y_1Ba_2Cu_3O_{7-x}$ oxide superconductor thin film can be deposited by an arbitrary method such as various sputtering methods, a MBE method, a vacuum evaporation method, a CVD method etc.

Figure 1:
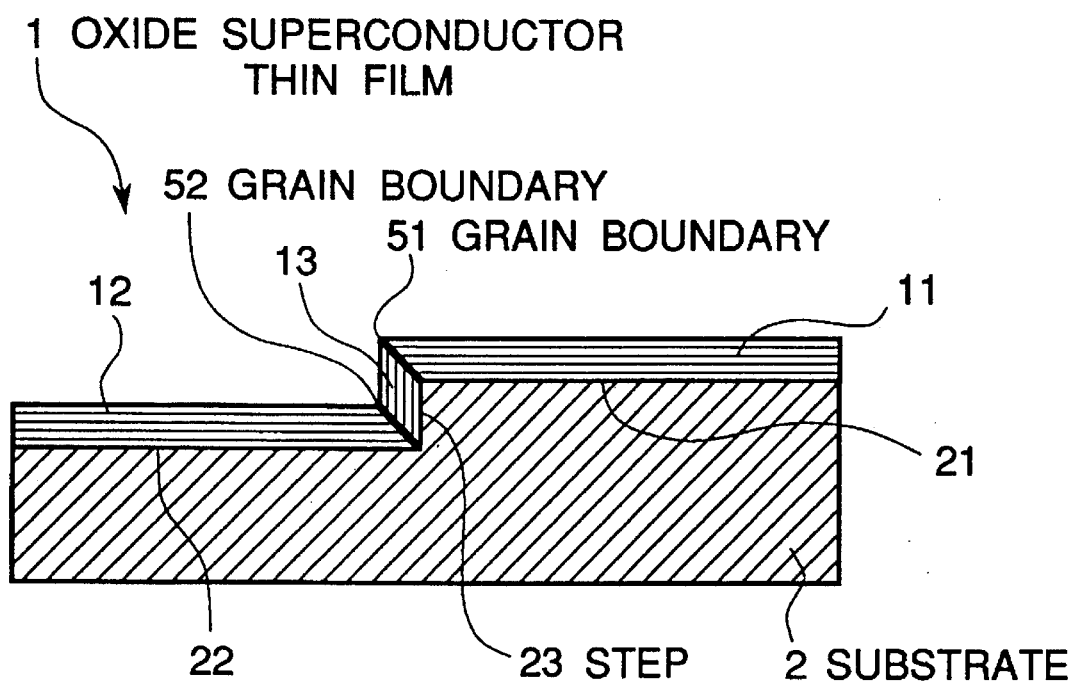
FIG. 1 is a diagrammatic sectional view of an example of a step edge type Josephson junction device.

As shown in FIG. 1, each of the $Y_1Ba_2Cu_3O_{7-x}$ oxide superconductor thin films 1 deposited on the substrates 2 on which the steps 23 were formed in accordance with the present invention had two regions 11 and 12 formed of c-axis orientated $Y_1Ba_2Cu_3O_{7-x}$ oxide superconductor single crystals on the non-etched surface 21 and the etched surface 22 of the substrate 2, which were connected by a portion 13 having a different crystal orientation positioned at the step 23. Grain boundaries 51 and 52 were created at the interfaces between the portions 11 and 13 and between 12 and 13 so that a weak link of a Josephson junction was formed.

Embodiment 2

Figure 3:
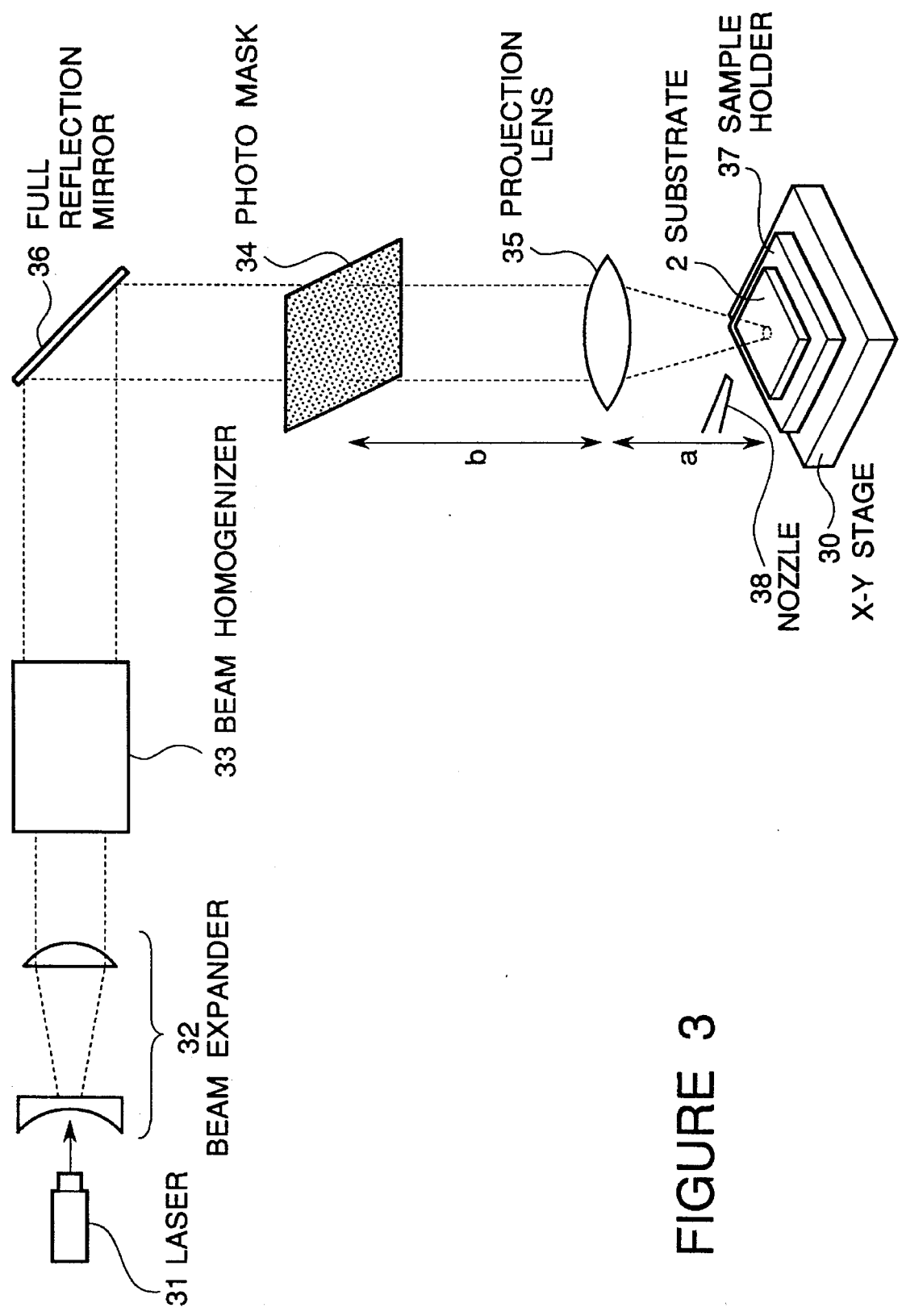
FIG. 3 is a schematic view illustrating an arrangement of optical devices utilized in the second embodiment of the method in accordance with the present invention.

Step edge type Josephson junction devices were manufactured by using MgO single crystalline substrates of 40 mm square having steps formed by the method in accordance with the present invention. Referring to FIG. 3, an arrangement of optical devices of an apparatus utilized in this embodiment will be described.

As shown in FIG. 3, the apparatus comprises an excimer laser 31 equal to that of Embodiment 1, a beam expander 32, a beam homogenizer 33, a full reflection mirror 36, a photomask 34, and a projection lens 35, which are disposed on the same optical axis. A laser beam emitted from the excimer laser 31 passes through the beam expander 32 and the beam homogenizer 33, is reflected by the mirror 36 to the photomask 34 and is projected to the substrate 2 set on a sample holder 37 by the projection lens 35 so as to etch the substrate 2. The sample holder 37 can be cooled by forced water cooling so as to prevent the substrate 2 from heating. The sample holder 37 is mounted on a X-Y stage 30 so as to move the substrate 2. In addition, a nozzle 38 is disposed near the substrate 2 to jet an inert gas to the substrate 2 so as to blow away debris.

In this embodiment, the same excimer lasers as Embodiment 1 were used. The photomask 34 had a pattern of a dimension of 80 mm×80 mm and the substrate 2 had a dimension of 40 mm×40 mm. The distance a was equal to 200 mm, the distance b was equal to 800 mm and the focal length f was equal to 160 mm so as to realize a reduced projection of a rate of ¼. The mask pattern was projected to have a dimension of 20 mm×20 mm on the substrate 2.

By using the above apparatus, the MgO substrates were etched so as to form steps on their deposition surfaces. In this embodiment, the substrates were moved by the X-Y stage 30 so that four different portions were etched in each substrate. Conditions of the etching were the same as Embodiment 1. During the etching, the sample holder 37 was cooled by forced water cooling so as to prevent the substrate 2 from heating and argon gas was jetted to the substrate 2 at a velocity of 3.0 meters/second and a flow rate 1000 sccm from the nozzle 38 so as to blow away debris.

Portions of the MgO single crystal substrates 2 exposed to the laser beams were etched to a depth of 200 nanometers so as to form steps having a height of 200 nanometers. Steps formed on the substrates 2 abruptly rose at an angle of 85°. Observations of the steps formed by the etching of the five species of excimer lasers conducted by using a scanning electron microscopy showed little differences among them. In addition, it became clear that the etched surfaces of the substrates also had high crystallinity.

When the energy density of the laser beam was not more than 100 miliJoules/cm$^2$, no effective etching was performed so that it might take several tens of hours to form a step having a required height. On the other hand, when the energy density of the laser beam was not less than 5 Joules/cm$^2$, an etched surface was roughened or cracked so that it became difficult to deposit a crystalline oxide superconductor thin film having excellent properties. Therefore, the energy density of the laser beam preferably from 100 miliJoules/cm$^2$ to 5 Joules/cm$^2$.

$Y_1Ba_2Cu_3O_{7-x}$ oxide superconductor thin films having a thickness of 300 nanometers were deposited on the substrates 2 by laser ablation under the same conditions as Embodiment 1, each of the $Y_1Ba_2Cu_3O_{7-x}$ oxide superconductor thin films deposited on the substrates on which the steps were formed in accordance with the present invention had two regions formed of c-axis or entated $Y_1Ba_2Cu_3O_{7-x}$ oxide. superconductor single crystals on the non-etched surface and the etched surface of the substrate, which were connected by a portion having a different crystal orientation positioned at the step. Grain boundaries and were created at the interfaces between the portions so that a weak link of a Josephson junction was formed.

In the above method of the present invention, it is possible to increase an etching rate by increasing the laser pulse rate, which improves process efficiency. In Embodiments 1 and 2, only excimer lasers were used. However, harmonics of a NdYAG laser can be used instead of the excimer lasers. The harmonic laser of the NdYAG laser is an ultra violet laser similar to the excimer laser and also has a pulse width of several tens of nanometers similar to the excimer laser. Therefore, almost the same result can be obtained in the case of using the harmonic laser of the NdYAG laser instead of the excimer laser.

As explained above, in accordance with the method of the present invention, it becomes possible to form a step on a deposition surface of a substrate without degrading the deposition surface of the substrate. In addition, a high quality oxide superconductor thin film can be deposited on the deposition surface of the substrate processed in accordance with the method of the present invention, so that superconducting devices such as step edge type Josephson junction devices can be easily manufactured.

In addition, the oxide superconductor thin film can be formed of not only the Y—Ba—Cu—O compound oxide superconductor material, but also a high-$T_c$ (high critical temperature) oxide superconductor material, particularly a high-$T_c$ copper-oxide type compound oxide superconductor material, for example a Bi—Sr—Ca—Cu—O compound oxide superconductor material, and a Tl—Ba—Ca—Cu—O compound oxide superconductor material.

The invention has thus been shown and described with reference to the specific embodiments. However, it should be noted that the present invention is in no way limited to the details of the illustrated structures but modifications may be made within the scope of the appended claims.

I claim:

1. A method for forming a step on a deposition surface of a substrate for depositing a thin film on the surface, the method comprising the steps of:

etching a portion of the deposition surface of the substrate by emitting a laser beam to the portion, and cooling the substrate by forced water cooling during the etching.

2. A method as claimed in claim 1, wherein the laser is a pulse oscillating ultra violet laser having a wavelength of not longer than 351 nanometers.

3. A method as claimed in claim 2, wherein the laser is selected from the group consisting of a $F_2$ excimer laser, an ArF excimer laser, a KrF excimer laser, a XeCl excimer laser, a XeF excimer laser and a harmonic laser of a NdYAG laser.

4. A method as claimed in claim 3, wherein the laser has an energy density ranging from 100 miliJoules/cm$^2$ to 5 Joules/cm$^2$ per a pulse on the substrate.

5. A method as claimed in claim 1, wherein a photomask is disposed in a light path of the laser beam so as to direct the laser beam to the portion of the deposition surface of the substrate.

6. A method as claimed in claim 1, wherein different portions of the deposition surface of the substrate are etched by the laser beam so as to form plural steps on the deposition surface.

* * * * *